(12) United States Patent
Malik

(10) Patent No.: US 6,657,564 B2
(45) Date of Patent: Dec. 2, 2003

(54) METHOD AND APPARATUS FOR COMPRESSING DATA IN WHICH DICTIONARY SIZES ARE REDUCED

(75) Inventor: Nadeem Malik, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/015,238

(22) Filed: Dec. 13, 2001

(65) Prior Publication Data

US 2003/0112161 A1 Jun. 19, 2003

(51) Int. Cl.[7] .................................................. H03M 7/34
(52) U.S. Cl. ........................................... 341/51; 341/50
(58) Field of Search ............................... 341/50, 51, 67

(56) References Cited

U.S. PATENT DOCUMENTS 5,561,421 A  * 10/1996 Smith et al. ................... 341/51
5,982,441 A  * 11/1999 Hurd et al. ................... 348/417
6,121,901 A  *  9/2000 Welch et al. ................... 341/51
6,353,807 B1 *  3/2002 Tsutsui et al. .............. 704/230

* cited by examiner

Primary Examiner—Jean Bruner Jean Glaude
Assistant Examiner—Joseph J Lauture
(74) Attorney, Agent, or Firm—Duke W. Yee; Mark E. McBurney

(57) ABSTRACT

A method, apparatus, and computer instructions for compressing data. A segment of data within the data to be compressed is selected. A determination is made as to whether the data segment matches a previous segment within the data based on a transform performed on the data segment. The data segment of data is replaced with a code word in response to a determination that a match is present between the data segment and the previous data segment. These steps are repeated for subsequent data segments within the data until all of the data has been processed to form compressed data.

34 Claims, 3 Drawing Sheets

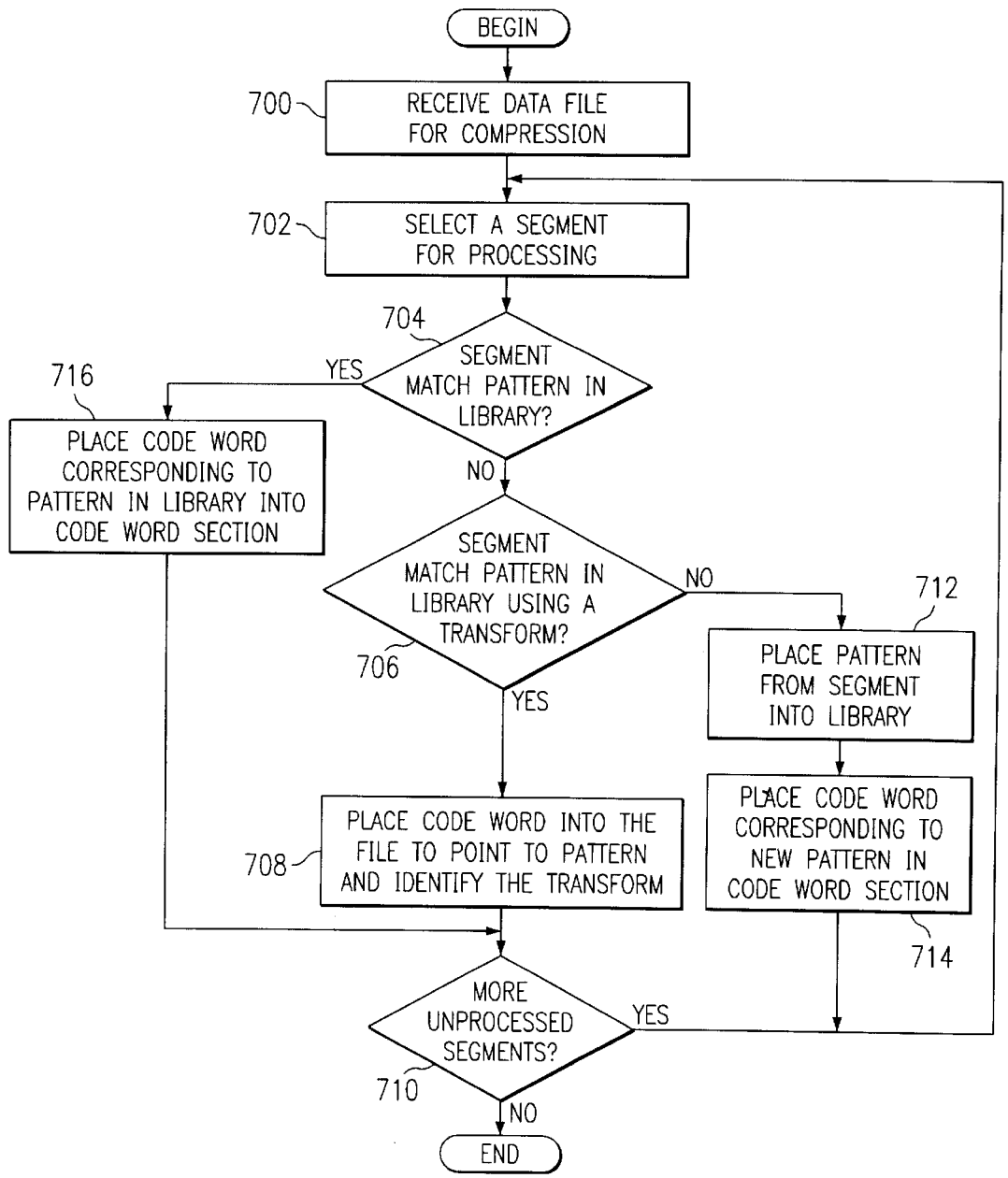

METHOD AND APPARATUS FOR COMPRESSING DATA IN WHICH DICTIONARY SIZES ARE REDUCED

BACKGROUND OF THE INVENTION

1. Technical Field

The present invention relates generally to an improved data processing system, and in particular, to a method and apparatus for compressing data. Still more particularly, the present invention provides a method and apparatus for reducing dictionary sizes and the compression of data.

2. Description of Related Art

With more and more documents, graphics, video, and databases being created and used, storage space for storing these and other types of data has become an issue. Often times, the amount of data may exceed the currently available storage space, requiring removal of some data or acquiring additional storage space. Another solution to this storage space issue is the use of data compression to make more space available.

Data compression involves encoding data to take up less storage space. Digital data is compressed by finding repeatable patterns of binary zeros and ones. The more patterns can be found, the more the data can be compressed. Text can generally be compressed to about 40 percent of its original size, and graphics files from 20 percent to 90 percent. Some files can only be compressed by a small amount. The amount of compression that may occur depends entirely on the type of file and compression algorithm used.

Numerous compression methods are presently used. Two major compression technologies are Huffman coding and Lempel-Ziv-Welch (LZW), representing examples of the statistical and dictionary compression methods. These compression techniques are based on a dictionary approach. In all such techniques, repeating patterns in the input data are essentially replaced by the index numbers, referred to as a code word, of the patterns when they were first encountered. Since the compressed file includes the dictionary in the compressed file so that the file can be uncompressed back to the original state, the size of the dictionary also plays a role in the effective compression rate.

Therefore, it would be advantageous to have an improved method, apparatus, and computer instructions to reduce dictionary sizes to improve compression ratios.

SUMMARY OF THE INVENTION

The present invention provides a method, apparatus, and computer instructions for compressing data. A segment of data within the data to be compressed is selected. A determination is made as to whether the data segment matches a previous segment within the data based on a transform performed on the data segment. The data segment of data is replaced with a code word in response to a determination that a match is present between the data segment and the previous data segment. These steps are repeated for subsequent data segments within the data until all of the data has been processed to form compressed data.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 7 is a flowchart of a process used for compressing data using transforms in accordance with a preferred embodiment of the present invention.

DETAILED DESCRIPTION OF THE PREFERRED EMBODIMENT

Figure 1:
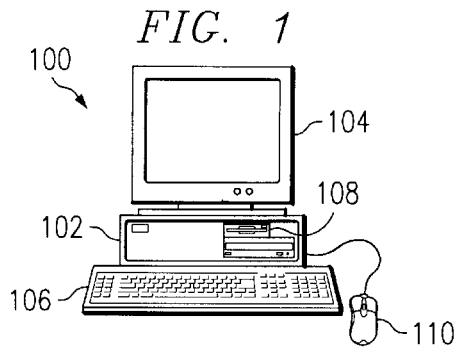
FIG. 1 is a pictorial representation of a data processing system in which the present invention may be implemented in accordance with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

Figure 2:
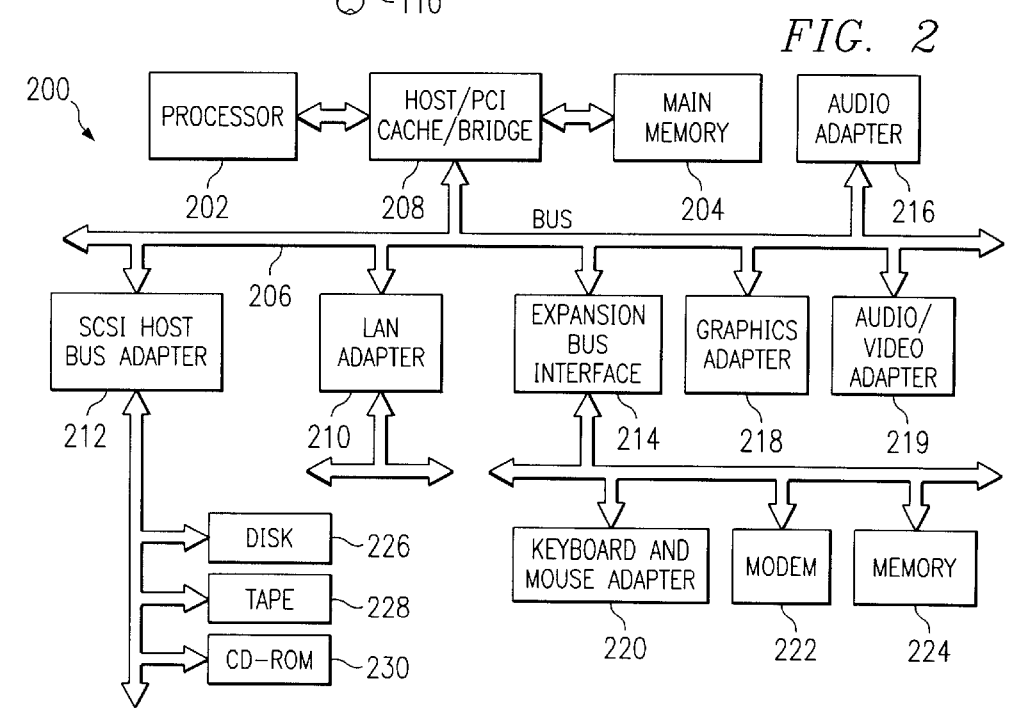
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. In particular, code for reducing dictionary sizes in the compression of data is implemented in data processing system 200.

Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a server computer, notebook computer, or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

Figure 3:
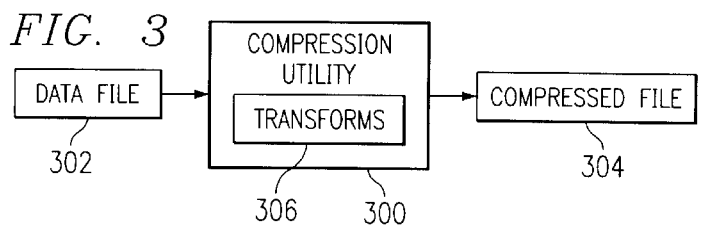
FIG. 3 is a diagram illustrating a compression process in accordance with a preferred embodiment of the present invention.

With reference now to FIG. 3, a diagram illustrating a compression process is depicted in accordance with a preferred embodiment of the present invention. In this example, compression utility 300 may be implemented in a data processing system, such as data processing system 200 in FIG. 2.

The present invention receives data file 302 at compression utility 300 and processes data file 302 to generate compressed file 304. As part of this process, compression utility 300 employs transforms 306 in an attempt to reduce the dictionary size for compressed file 304. Compression utility 300 compresses data file 302 by examining segments within the file. For example, the segments may be 64 bit or 128 bit segments. Compression utility 300 searches for patterns in segments that have already been encountered within data file 302. When a segment contains a pattern that repeats, a code word is used in place of the pattern within compressed file 304. The mechanism of the present invention reuses a dictionary entry for more than one pattern within data file 302.

The reuse is made effectively by applying a functional transform to an existing dictionary entry such that the existing dictionary entry matches with the required pattern that needs to be stored as a new entry in the dictionary. If a transform does result in a match, then the dictionary entry only consists of the code for the transform along with the index to the original patterns in the dictionary. Otherwise a new entry is made in the dictionary as usual.

For example, in an existing compression mechanism, such as Limpel-Ziv, a compressed file is made up of the code stream, the sequence of offset values, also referred to as code words, to a previous occurrence of the pattern or the actual literal pattern itself if this is the first occurrence. In this example, an assumption is made to allow the code words to reference a pattern up to an offset of up to 255 bytes from the current location in the code stream. Also, an assumption is made to allow the maximum pattern width to be 256 bits wide. Given these assumptions, the code word is equal to 8 bits for the offset plus 1 bit to indicate whether the segment or section of bits is a code word or a literal pattern itself. If the segment is a code word, then the segment is only 9 bits wide. If the segment is a pattern, then the pattern is 256 bits wide.

Currently, a code word only references an existing pattern (dictionary) if and only if the current bit pattern has an exact match with a previous pattern, otherwise the code stream ends up containing the actual literal pattern. In a preferred embodiment of the present invention, the code word is enhanced by adding bits to identify transforms and operands. In the depicted example, 2 bits are used to identify a set of four functional transforms. An additional 8 bits are used in the code word as an offset to a second operand for the functional transform. Another bit is used to differentiate a code word with transform versus one without the transform.

Thus, in this example a code word is extended from 11 bits to 20 bits. However, if the input file has a pattern of more than 19 bits that can now be mapped through the transform to a previous dictionary word in the code stream, the compressed file has a higher compression ratio since less bits are now required to represent the code stream.

Figure 4A:
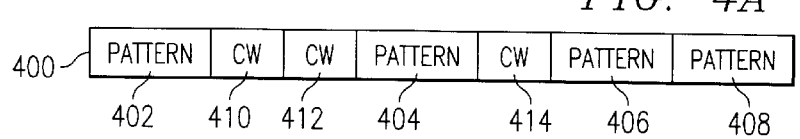
FIGS. 4A–4B are diagrams illustrating compressed files in accordance with a preferred embodiment of the present invention.
Figure 4B:
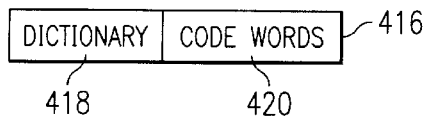

Turning next to FIGS. 4A–4B, diagrams illustrating compressed files are depicted in accordance with a preferred embodiment of the present invention. In FIG. 4A, file 400 is an example of a compressed file, which may be produced using a compression utility, such as compression utility 300 in FIG. 3. In this example, file 400 includes patterns 402, 404, 406, and 408, as well as code words (CWs) 410, 412, and 414. In this particular compression process, the code words include offsets pointing to a previous pattern. For example, code words 410 and 412 may point to pattern 402. These code words contain the format as described below with respect to FIG. 5.

Next, with respect to FIG. 4B, file 416 is another example of a compressed file, which may be generated by a compression utility. In this particular example, file 416 contains dictionary section 418 and code word section 420. Dictionary section 418 contains segments of data in which the pattern in each segment is different from the pattern in another segment in dictionary section 418. Code word section 420 contains code words for each entry within dictionary section 418. In other words, each data segment in the original file is replaced with a code word found in code word section 420. The format of these code words may be implemented as illustrated in FIG. 5 as described below.

Figure 5:
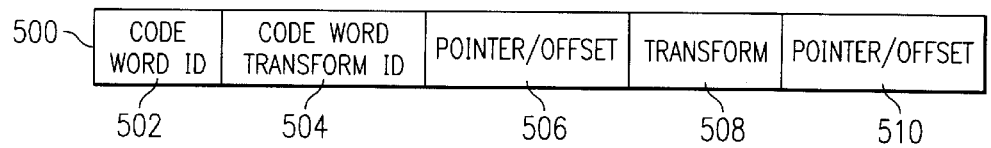
FIG. 5 is a diagram illustrating a code word in accordance with a preferred embodiment of the present invention.

With reference now to FIG. 5, a diagram illustrating a code word is depicted in accordance with a preferred embodiment of the present invention. In this example, code word 500 contains code word ID 502, code word transform ID 504, pointer/offset 506, transform 508, and pointer/offset 510. In this example, code word ID 502 is used to identify the data following this section as being either a code word or an existing pattern. In code word 500, in this example, code word ID 502 is a single bit set to a logic 1 to indicate that the following data is a code word. Code word transform ID 504 is used to indicate that the code word is based on a functional transform. In this example, the bit is set to a logic 1 to indicate that a functional transform is used to provide a match to a dictionary entry or previous pattern.

Pointer/offset 506 is used to identify an operand for the transform. This operand is a pattern in the dictionary. Transform 508 is used to identify the transform that is used to match the pattern. In this example, transform 508 is 2 bits and may be used to identify up to four transforms. Pointer/offset 510 is used to identify the second operand for the transform.

For example, an assumption is made that the following four transforms are supported: AND (00), XOR (01), ROTATE (10) AND OR (11). The bits in parenthesis indicate the 2 bit coding used in code word ID 502 to represent the transform function. If at offset 64 from current position a previous pattern in hexadecimal is "0xAAAAAAAA" and a current pattern is "0x55555555", then a rotate of the previous pattern by 1 would result in a match with the current pattern. Thus, this code word in bits would be "1 1 00100000 10 00000001". The first bit being 1 indicates that the data following the bit is a code word and not a pattern. The second bit, also a logic 1, indicates that the code word is based on a functional transform. The next 8 bits, "00100000", are the offset in binary from the current location. The next two bits, "10", define the functional transform to be rotate. Finally, the last set of 8 bits, "00000001", is the number of times the pattern should be rotated, which is one. If for example the function was an AND, XOR or OR function, the last set of 8 bits would be the offset to the second operand that would result in a match with the current pattern.

Figure 6:
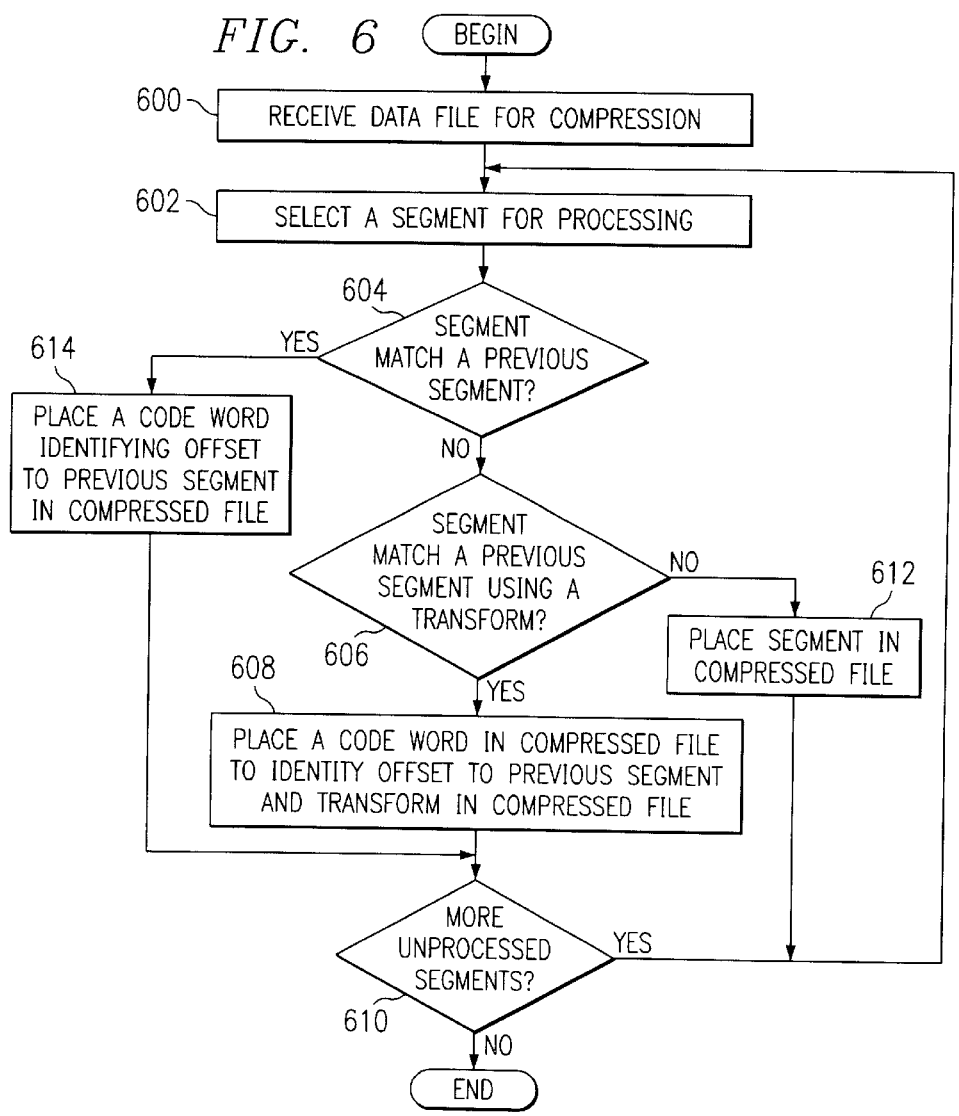
FIG. 6 is a flowchart of a process used for compressing a data file with transforms in accordance with a preferred embodiment of the present invention.

Turning next to FIG. 6, a flowchart of a process used for compressing a data file with transforms is depicted in accordance with a preferred embodiment of the present invention. The process illustrated in FIG. 6 may be implemented in a compression utility, such as compression utility 300 in FIG. 3. The process described in this figure generates a compressed file similar to file 400 in FIG. 4A.

The process begins by receiving a data file for compression (step 600). A segment is selected for processing (step 602). In these examples, equal size segments are selected for processing. For example, the data file may be processed in 128 bit segments or portions. The selection is done sequentially within the file. Next, a determination is made as to whether the segment matches a previous segment (step 604). If the segment does not match a previous segment, a determination is made as to whether the segment matches a previous segment using a transform (step 606). Step 606 may involve attempting a match with a single transform or with multiple transforms if multiple transforms are provided. If the segment does match a previous segment using a transform, a code word is placed in the compressed file to identify the offset to a previous segment and to a transform (step 608). The code word may take a form similar to code word 500 in FIG. 5.

Next, a determination is made as to whether more unprocessed segments are present (step 610). If more unprocessed segments are absent, the process terminates. If more unprocessed segments are present, the process returns to step 602 as described above.

Returning again to step 606, if the segment does not match a previous segment using a transform, the segment is placed in a compressed file (step 612) and the process returns to step 602 as described above. With reference again to step 604, if the segment matches a previous segment, a code word identifying the offset to the previous segment is placed in the compressed file (step 614) and the process proceeds to step 610 as described above.

With reference now to FIG. 7, a flowchart of a process used for compressing data using transforms is depicted in accordance with a preferred embodiment of the present invention. The process illustrated in FIG. 7 may be implemented in a compression utility, such as compression utility 300 in FIG. 3. The process described in this figure generates a compressed file similar to file 416 in FIG. 4B.

The process begins by receiving a data file for compression (step 700). A segment is selected for processing (step 702). As described with respect to FIG. 6, equal size segments are sequentially selected for processing. A determination is then made as to whether a segment matches the pattern in the library (step 704). If the segment does not match the pattern in the library, a determination is made as to whether the segment matches the pattern in the library using a transform (step 706). If the segment does match the pattern in the library using a transform, a code word is placed into the file to point to the pattern and identify the transform (step 708).

Next, a determination is made as to whether there are more unprocessed segments (step 710). If there are no more unprocessed segments, the process terminates. If more unprocessed segments are present, the process returns to step 702 as described above.

With reference again to step 706, if the segment does not match the pattern in the library using a transform, the pattern from the segment is placed into the library (step 712). A code word corresponding to the new pattern is placed in the code word section (step 714) and the process returns to 702 as described above. In step 714, the code word would indicate that no transform was used.

Turning again to step 704, if the segment does match the pattern in the library, a code word corresponding to the pattern in the library is placed into the code word section (step 716) and the process proceeds to step 710 as described above. In other words, the code word placed into the file would point to the pattern in the library. Either a pointer or an offset may be used.

Thus, the present invention provides an improved method, apparatus, and computer instructions for improving compression ratios in compressing data. The mechanism of the present invention provides this advantage by reducing dictionary sizes through the use of transforms. Further, the particular format of code words and the types of transforms described herein are provided as examples and are not intended as limitations to the present invention. For example, depending on the particular implementation, a more compact or efficient compression process may be used in place of the one described above.

Furthermore, the number of bits used to indicate features such as the number of possible transforms and the maximum number of pattern bits may be set to a range of possible values for a corresponding range of function types, size, speed, and compression-ratio trade-offs. These and other changes needed to implement the use of transforms to reduce dictionary sizes using transforms may be made depending on the particular compression scheme implemented.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for compressing data, the method comprising:
   (a) selecting a data segment within the data to be compressed;
   (b) determining whether the data segment matches a previous data segment within the data based on a transform performed on the data segment;
   (c) responsive to a determination that a match is present between the data segment and a previous data segment, replacing the data segment with a code word; and
   repeating steps (a) through (c) for subsequent data segments within the data until all of the data has been processed to form compressed data.

2. The method of claim 1, wherein the code word is 20 bits long.

3. The method of claim 2, wherein each data segment is at least 20 bits long.

4. The method of claim 1, wherein the code word includes a pointer to the previous data segment.

5. The method of claim 4, wherein the pointer is an offset.

6. The method of claim 1 further comprising:
   determining whether the data segment matches a previous segment within the data; and
   responsive to a determination that a match is present between the data segment and a previous data segment, replacing the data segment of data with a code word.

7. A method in a data processing system for compressing data, the method comprising:
   (a) selecting a data segment within the data to be compressed;
   (b) determining whether the data segment matches a previous data segment within the data based on a transform performed on the data segment, wherein the transform is selected from a set of transforms;
   (c) responsive to a determination that a match is present between the data segment and a previous data segment, replacing the data segment with a code word; and
   repeating steps (a) through (c) for subsequent data segments within the data until all of the data has been processed to form compressed data.

8. The method of claim 7, wherein the determining step includes determining whether the data segment matches the previous data segment using each of the transforms from the set of transforms.

9. The method of claim 7, wherein the set of transforms includes at least one of an AND function, an XOR function, a rotate function, and an OR function.

10. A method in a data processing system for compressing data, the method comprising:
    (a) receiving the data for compression;
    (b) selecting a data segment within the data to be compressed;
    (c) determining whether the data segment twitches a pattern in a library based on a transform performed on the data segment;
    (d) responsive to a determination that a match is present between the data segment and the pattern, replacing the data segment with a code word associated with the pattern;
    (e) responsive to a determination that a match is absent between the data segment and the pattern, placing the data segment in the library as a new pattern;
    (f) responsive to the new pattern being placed in the library, replacing the data segment with a code word associated with the new pattern; and
    repeating steps (b) through (f) until all of the data has been processed to form compressed data.

11. The method of claim 10, wherein the code word is 20 bits long.

12. The method of claim 11, wherein each data segment is at least 20 bits long.

13. A method in a data processing system for compressing data, the method comprising:
    (a) receiving the data for compression;
    (b) selecting a data segment within the data to be compressed;
    (c) determining whether the data segment matches a pattern in a library based on a transform performed on the data segment, wherein the transform is selected from a set of transforms;

(d) responsive to a determination that a match is present between the data segment and the pattern, replacing the data segment with a code word associated with the pattern;

(e) responsive to a determination that a match is absent between the data segment and the pattern, placing the data segment in the library as a new pattern;

(f) responsive to the new pattern being placed in the library, replacing the data segment with a code word associated with the new pattern; and repeating steps (b) through (f) until all of the data has been processed to form compressed data.

14. The method of claim 13, wherein the determining step includes determining whether the data segment matches a previous data segment using each of the transforms from the set of transforms.

15. The method of claim 13, wherein the set of transforms includes at least one of an AND function, an XOR function, a rotate function, and an OR function.

16. A data processing system for compressing data, the data processing system comprising;
   a bus system;
   a communications unit connected to the bus system;
   a memory connected to the bus system, wherein the memory includes a set of instructions; and
   a processing unit connected to the bus system, wherein the processing unit executes the set of instructions to (a) select a data segment within the data to be compressed; (b) determine whether the data segment matches a previous data segment within the data based on a transform performed on the data segment; (c) replacing the data segment with a code word in response to a determination hint a match is present between the data segment and a previous data segment; and repeat instructions for (a) through (c) for subsequent data segments within the data until all of the data has been processed to form compressed data.

17. A data processing system for compressing data, the data processing system comprising:
   a bus system;
   a communications unit connected to the bus system;
   a memory connected to the bus system, wherein the memory includes a set of instructions; and
   a processing unit connected to the bus system, wherein the processing unit executes the set of instructions to (a) receive (lie data for compression; (b) select a data segment within the data to be compressed; (e) determine whether the data segment matches a pattern in a library based on a transform performed on the data segment; (d) replace the data segment with a code word associated with the pattern in response to a determination that a match is present between the data segment and the pattern; (e) place the data segment in the library as a new pattern in response to a determination that a match is absent between the data segment and the pattern; (f) replace the data segment with a code word associated with the new pattern in response to the new pattern being placed in the library; and repeat instructions for (b) through (f) until all of the data has been processed to form compressed data.

18. A data processing system for compressing data, the data processing system comprising:
   selecting means for selecting a data segment within the data to be compressed;
   determining means for determining whether the data segment matches a previous data segment within the data based on a transform performed on the data segment;
   replacing means, in response to a determination that a match is present between the data segment and a previous data segment, for replacing the data segment with a code word; and
   repeating means for reinitiating the selecting means, determining means, and replacing means for subsequent data segments within the data until all of the data has been processed to form compressed data.

19. The data processing system of claim 18, wherein the code word is 20 bits long.

20. The data processing system of claim 19, wherein the each segment is at least 20 bits long.

21. The data processing system of claim 18, wherein the code word includes a pointer to the previous data segment.

22. The data processing system of claim 21, wherein the pointer is an offset.

23. The data processing system of claim 18, wherein the determining means is a first determining means, the replacing means is a first replacing means, and further comprising:
   second determining means for determining whether the data segment marches a previous segment within the data; and
   second replacing means, in response to a determination that a march is present between the data segment and a previous data segment, for replacing the data segment of data with a code word.

24. A data processing system for compressing data, the data processing system comprising:
   selecting means for selecting a data segment within the data to be compressed;
   determining means for determining whether the data segment matches a previous data segment within the data based on a transform performed on the data segment, wherein the transform is selected from a set of transforms;
   replacing means, in response to a determination that a match is present between the data segment and a previous data segment, for replacing the data segment with a code word; and
   repeating means for reinitiating the selecting means, determining, means, and replacing means for subsequent data segments within the data until all of the data has been processed to form compressed data.

25. The data processing system of claim 24, wherein the determining means includes means for determining whether the data segment matches the previous data segment using each of the transforms from the set of transforms.

26. The data processing system of claim 24, wherein the set of transforms includes at least one of an AND function, an XOR function, a rotate function, and an OR function.

27. A data processing system for compressing data, the data processing system comprising:
   receiving moans for receiving the data for compression;
   selecting means for selecting a data segment within the data to be compressed;
   determining means for determining whether the data segment matches a pattern in a library based on a transform performed on the data segment;
   first replacing means, in response to a determination that a match is present between the data segment and the pattern, for replacing the data segment of data with a code word associated with the pattern;
   placing means, in response to a determination that a match is absent between the data segment and the pattern, for placing the data segment in the library as a new pattern;

second replacing means, in response to the new pattern being placed in the library, for replacing the data segment wit a code word associated with the new pattern; and repeating means for reinitiating the receiving means, selecting means, determining means, first replacing means, and Second replacing means until all of the data has been processed to form compressed data.

28. The data processing system of claim 27, wherein the code word is 20 bits long.

29. The data processing system of claim 28, wherein the each segment is at least 20 bits long.

30. A data processing system for compressing data, the data processing system comprising:

receiving means for receiving the data for compression;

selecting means for selecting a data segment within the data to be compressed;

determining means for determining whether the data segment matches a pattern in a library based on a transform performed on the data segment, wherein the transform is selected from a set of transforms;

first replacing means, in response to a determination that a match is present between the data segment and the pattern, for replacing the data segment of data with a code word associated with the pattern;

placing means, in response to a determination that a match is absent between the data segment and the pattern, for placing the data segment in the library as a new pattern;

second replacing means, in response to the new pattern being placed in the library, for replacing the data segment with a code word associated with the new pattern; and repeating means for reinitiating the receiving means, selecting means, determining means, first replacing means, and second replacing means until all of the data has been processed to form compressed data.

31. The data processing system of claim 30, wherein the determining means includes means for determining whether the data segment matches a previous data segment using each of the transforms from the set of transforms.

32. The data processing system of claim 30, wherein the set of transforms includes at least one of an AND function, an XOR function, a rotate function, and an OR function.

33. A computer program product in a computer readable medium for compressing data, the computer program product comprising:

first instructions for selecting a data segment within the data to be compressed;

second instructions for determining whether the data segment matches a previous data segment within the data based on a transform performed on the data segment;

third instructions, responsive to a determination that a match is present between the data segment and a previous data segment, for replacing the data segment with a code word; and fourth instructions for initiating the first instructions, second instructions, and third instructions for subsequent data segments within the data until all of the data has been processed to form compressed data.

34. A computer program product in a computer readable medium for compressing data, the computer program product comprising:

first instructions for receiving the data for compression;

second instructions for selecting a data segment within the data to be compressed;

third instructions for determining whether the data segment matches a pattern in a library based on a transform performed on the data segment;

fourth instructions, responsive to a determination that a match is present between the data segment and the pattern, for replacing the data segment with a code word associated with the pattern;

fifth instructions, responsive to a determination that a match is absent between the data segment and the pattern, for placing the data segment in the library as a new pattern;

sixth instructions, responsive to the new pattern being placed in the library, for replacing the data segment with a code word associated with the new pattern; and seventh instructions for reinitiating the first instructions, second instructions, third instructions, fourth instructions, fifth instructions, and sixth instructions until all of the data has been processed to form compressed data.

* * * * *

UNITED STATES PATENT AND TRADEMARK OFFICE
CERTIFICATE OF CORRECTION

PATENT NO. : 6,657,564 B2
DATED : December 2, 2003
INVENTOR(S) : Malik

It is certified that error appears in the above-identified patent and that said Letters Patent is hereby corrected as shown below:

Column 8,
Line 38, after "segment;" delete "twiches" and insert -- matches --.

Column 9,
Line 33, after "determination", delete "hint" and insert -- that --.
Line 46, after "receive", delete "(lie" and insert -- the --.

Column 10,
Line 21, after "data segment", delete "marches" and insert -- matches --.
Line 24, after "that a", delete "marches" and insert -- matches --.
Line 41, delete "determining," and insert -- determining --.
Line 53, delete "receiving moans" and insert -- receiving means --.

Column 11,
Line 3, after "segment", delete "writ" and insert -- with --.
Line 7, after "means, and", delete "Second" and insert -- second --.

Signed and Sealed this

Eighteenth Day of May, 2004

JON W. DUDAS
*Acting Director of the United States Patent and Trademark Office*